United States Patent
Boss et al.

(10) Patent No.: US 12,249,804 B2
(45) Date of Patent: Mar. 11, 2025

(54) OPTOELECTRONIC COMPONENT

(71) Applicant: OSRAM Opto Semiconductors GmbH, Regensburg (DE)

(72) Inventors: Markus Boss, Regensburg (DE); Herbert Brunner, Sinzing (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 566 days.

(21) Appl. No.: 17/627,296

(22) PCT Filed: Jun. 29, 2020

(86) PCT No.: PCT/EP2020/068222
§ 371 (c)(1),
(2) Date: Jan. 14, 2022

(87) PCT Pub. No.: WO2021/008864
PCT Pub. Date: Jan. 21, 2021

(65) Prior Publication Data
US 2022/0278501 A1    Sep. 1, 2022

(30) Foreign Application Priority Data
Jul. 17, 2019    (DE) ............... 10 2019 119 390.7

(51) Int. Cl.
*H01S 5/00* (2006.01)
*H01S 5/0232* (2021.01)
(Continued)

(52) U.S. Cl.
CPC ........ *H01S 5/0232* (2021.01); *H01S 5/02326* (2021.01); *H01S 5/02345* (2021.01); *H01S 5/06825* (2013.01); *H01S 5/02253* (2021.01)

(58) Field of Classification Search
CPC ............ H01S 5/0232; H01S 5/02326; H01S 5/02345; H01S 5/06825; H01S 5/02253; H01S 5/183
See application file for complete search history.

(56) References Cited

U.S. PATENT DOCUMENTS

| | | | | |
|---|---|---|---|---|
| 4,775,917 A | * | 10/1988 | Eichhorn | H05K 5/0069 361/776 |
| 2003/0031429 A1 | * | 2/2003 | Okayasu | H01S 5/0232 257/E25.032 |

(Continued)

FOREIGN PATENT DOCUMENTS

| | | |
|---|---|---|
| CN | 108305926 A | 7/2018 |
| DE | 102015116855 A1 | 4/2017 |

(Continued)

OTHER PUBLICATIONS

International Search Report (with English Translation) and Written Opinion in corresponding International Application No. PCT/EP2020/068222 mailed on Oct. 8, 2020, 14 pages.

*Primary Examiner* — Kinam Park
(74) *Attorney, Agent, or Firm* — MH2 Technology Law Group LLP

(57) ABSTRACT

The invention relates to an optoelectronic component comprising a housing, an optoelectronic semiconductor chip and an optical element. The housing comprises a lead frame which has two external electrical contact points and two contact portions. The housing also comprises a housing body in which the lead frame is embedded, wherein each contact portion extends laterally out of one of the external electrical contact points in each case to a mounting surface of the housing, and therefore contact surfaces of the contact portions are exposed on the mounting surface. An electrical (Continued)

Figure 1:
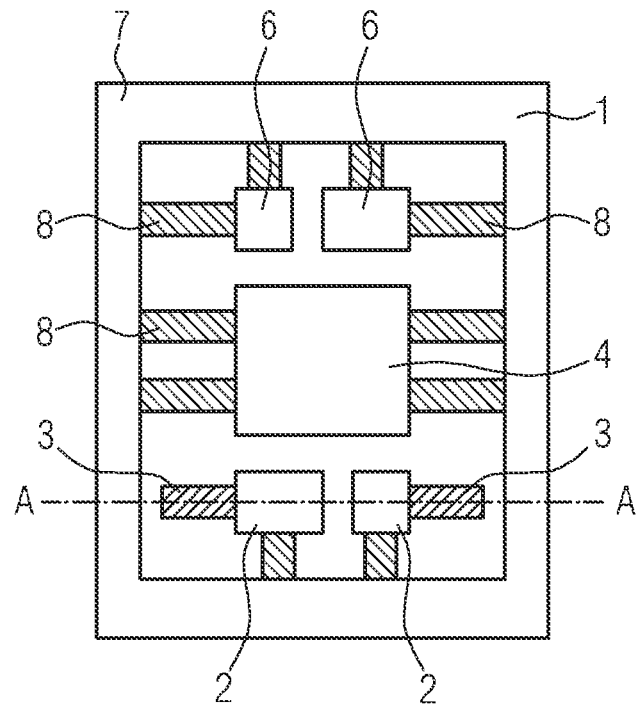

contact structure of the optical element is electrically conductively connected to the contact surfaces of the contact portions.

10 Claims, 4 Drawing Sheets

(51) Int. Cl.
  *H01S 5/02326* (2021.01)
  *H01S 5/02345* (2021.01)
  *H01S 5/068* (2006.01)
  *H01S 5/02253* (2021.01)

(56) References Cited

U.S. PATENT DOCUMENTS

| | | | |
|---|---|---|---|
| 2006/0027479 A1* | 2/2006 | Auburger | H01L 23/49575 257/E33.059 |
| 2006/0273338 A1 | 12/2006 | Lee et al. | |
| 2007/0165684 A1* | 7/2007 | Hamaoka | H01S 5/0232 372/36 |
| 2012/0181555 A1 | 7/2012 | Yoo et al. | |
| 2013/0156058 A1* | 6/2013 | Yamashita | H01S 5/0232 216/17 |
| 2013/0256862 A1* | 10/2013 | Zeiler | H01L 23/564 257/676 |
| 2014/0306330 A1 | 10/2014 | Williams | |
| 2018/0254605 A1* | 9/2018 | Wojcik | H01S 5/0231 |
| 2018/0261731 A1* | 9/2018 | Wojcik | H01L 33/00 |
| 2018/0337290 A1* | 11/2018 | Richter | H01L 31/02005 |
| 2019/0312407 A1* | 10/2019 | Halbritter | H01S 5/0421 |
| 2020/0303594 A1* | 9/2020 | Sorg | H01S 5/0237 |
| 2021/0273401 A1* | 9/2021 | Balimann | H01S 5/0236 |

FOREIGN PATENT DOCUMENTS

| | | |
|---|---|---|
| DE | 102016207947 A1 | 11/2017 |
| DE | 102017123413 A1 | 4/2019 |
| WO | 2020027721 A1 | 2/2020 |
| WO | 2020038776 A1 | 2/2020 |

* cited by examiner

OPTOELECTRONIC COMPONENT

CROSS-REFERENCE TO RELATED APPLICATIONS

This patent application is a national stage entry from International Application No. PCT/EP2020/063474, filed on May 14, 2020, published as International Publication No. WO 2020/234112 A1 on Nov. 26, 2020, and claims priority under 35 U.S.C. § 119 from German patent application 10 2019 113 315.7, filed May 20, 2019, the entire contents of all of which are incorporated by reference herein.

A housing for an optoelectronic component, a method for producing a housing for an optoelectronic component, an optoelectronic component and a method for producing an optoelectronic component are specified.

The intention is to specify an improved housing, in particular for an optoelectronic component. In particular, the intention is to specify a housing for an optoelectronic component in which the functionality of an optical element that the optoelectronic component comprises can be tested in a simple manner.

Moreover, the intention is to specify a simple method for producing such a housing, an improved optoelectronic component comprising such a housing, and an improved method for producing an optoelectronic component comprising such a housing.

These objects are achieved by a housing, a method, and an optoelectronic component as in the below claims.

The respective dependent claims relate to advantageous embodiments and developments of the housing, of the optoelectronic component and of the two methods.

In accordance with one embodiment, the housing comprises a leadframe having two external electrical contact locations and two contact webs.

In accordance with a further embodiment of the housing, the leadframe is embedded into a housing body. Particularly preferably, the leadframe is embedded into the housing body in such a way that only one surface of the leadframe, for example for electrical contacting, is freely accessible from outside. This surface of the leadframe preferably terminates flush with the surface of the housing body.

Particularly preferably, the external electrical contact locations are arranged at a bottom surface of the housing. By way of example, the external electrical contact locations terminate flush with the surrounding housing body.

Particularly preferably, each contact web extends laterally from a respective one of the external electrical contact locations to a mounting surface of the housing, such that contact surfaces of the contact webs are exposed at the mounting surface. The mounting surface is preferably configured and provided for the mounting of an optical element.

Particularly preferably, the contact webs, proceeding from the external electrical contact locations, run through the housing body to the mounting surface. In this case, the mounting surface is situated opposite the bottom surface of the housing body. In other words, the contact webs produce an electrically conductive connection from the bottom surface of the housing to the mounting surface of the housing. In particular, the contact webs are particularly preferably embodied integrally with the external electrical contact locations.

In accordance with a further embodiment, the housing comprises a housing wall extending around the mounting surface. By way of example, the housing wall extends completely around the mounting surface. However, it is also possible for the housing wall to have perforations. The housing wall is particularly preferably provided and configured for forming a boundary for an optical element placed onto the mounting surface.

In accordance with a further embodiment of the housing, the contact webs have a smaller thickness than the external electrical contact locations. By way of example, the external electrical contact locations have a thickness of between 200 micrometers and 300 micrometers inclusive. The contact webs have for example a thickness of between 80 micrometers and 150 micrometers inclusive.

In accordance with a further embodiment, the leadframe comprises an electrical connection location provided and configured for the mounting of an optoelectronic semiconductor chip. Said electrical connection location is embodied such that it is solderable, for example. The leadframe preferably additionally comprises further electrical connection locations provided and configured for the electrical contacting of the optoelectronic semiconductor chip, for example with the aid of a bond wire. Particularly preferably, said electrical connection locations are therefore embodied such that they are bondable.

In accordance with a further embodiment of the housing, the leadframe comprises a metal or is formed from a metal. By way of example, the leadframe comprises copper or is formed from copper. Furthermore, it is also possible for the leadframe at least partly to comprise a bondable coating. The bondable coating comprises for example gold or consists of gold.

By way of example, the housing body comprises a plastic or is formed from a plastic. By way of example, the plastic material is an epoxy. Particularly preferably, the housing body is embodied in black fashion.

The housing advantageously has a high design freedom in the configuration. Furthermore, the housing is advantageously embodied such that it is particularly mechanically robust, in particular since the leadframe is largely embedded in the housing body.

The housing can be produced by a method such as is described below. Features and embodiments described only in association with the housing can also be embodied in the case of the method, and vice versa.

In accordance with one embodiment of the method for producing a housing for an optoelectronic component, a leadframe is provided. Preferably, the leadframe has two external electrical contact locations and two contact webs. Particularly preferably, a respective contact web extends laterally from an external electrical contact location. Preferably, the external electrical contact locations and the contact webs lie in a main plane of extent of the leadframe when the leadframe is provided.

In accordance with a further embodiment of the method, the contact webs are bent out of the main plane of extent of the leadframe.

In accordance with a further embodiment of the method, a housing body is produced, which embeds the leadframe, such that each contact web extends laterally from one of the external electrical contact locations to a mounting surface of the housing, such that contact surfaces of the contact webs are exposed at the mounting surface. Particularly preferably, the housing body is produced after the contact webs have been bent out of the main plane of extent of the leadframe.

In accordance with one preferred embodiment of the method, the housing body is produced by foil assisted molding (FAM).

During foil assisted molding, a mold having at least two mold halves is provided, which form a cavity in the closed state. A surface of the mold halves is at least partly provided with a foil, for example a plastic foil. A workpiece, in the present case the leadframe, for example, is inserted into one of the mold halves. The mold halves are then closed, such that the workpiece is situated in the cavity of the mold. An initially liquid housing material is then introduced into the cavity of the mold and then cured, such that the housing material is molded onto the workpiece according to the mold shape. In the present case, the housing body is formed around the leadframe. In a next step, the workpiece is removed from the mold. On account of the mold halves being coated with the foil, removal from the mold advantageously takes place particularly simply and without defects.

Foil assisted molding has the advantage that the probability of the contact surfaces of the contact webs being contaminated with material of the housing body during production of the housing body is reduced.

In accordance with a further embodiment of the method, recesses are produced in the mounting surface of the housing body during production of the housing body. In this case, each contact surface is arranged at a bottom surface of a recess. In other words, each contact surface is surrounded by a recess. In particular, the recesses are produced in the mounting surface of the housing body during foil assisted molding. During foil assisted molding, the contact surfaces of the contact webs press into the foil with which the mold is lined. The recesses arise in this way. In other words, the recesses are evidence of the use of the method described here.

In accordance with a further embodiment of the method, the contact surfaces are cleaned after production of the housing body, for example with the aid of a laser or by means of water jet-guided particle beams (referred to as: "wetblasting").

In accordance with a further embodiment of the method, the contact webs are held under stress in the mold during production of the housing body. For this purpose, the contact webs preferably have an enlarged length. In this regard, the contamination of the contact surfaces of the contact webs with housing material can advantageously be at least reduced.

In accordance with a further embodiment of the method, the contact webs are provided with a further bend, such that the contact surface is enlarged. In this way, too, the contamination of the contact surfaces of the contact webs with housing material can advantageously be at least reduced.

In accordance with a further embodiment of the method, the leadframe is produced by a metal sheet firstly being provided and then being etched, with the result that the leadframe is formed. By way of example, before etching, a photoresist mask having the desired inverse structure is firstly applied. The metal sheet is then etched through the photoresist mask, particularly preferably in wet-chemical fashion. Afterward, the leadframe can be provided, for example electrolytically, with a bondable metallic coating.

In accordance with a further embodiment of the method, the contact webs are etched, such that they have a smaller thickness than the external electrical contact locations. If the contact webs have a smaller thickness than the external electrical contact locations, then the contact webs are easily bendable, while the mechanical stability of the leadframe is not impaired owing to the larger thickness of the external electrical contact locations.

In accordance with a further embodiment of the method, the leadframe has a supporting frame extending around, preferably extending completely around, the external electrical contact locations. Particularly preferably, the supporting frame likewise extends around the electrical connection location for the optoelectronic semiconductor chip and the further electrical connection locations for the bond wires. Particularly preferably, the contact webs are not connected to the supporting frame. The supporting frame contributes to the mechanical stability of the workpiece during the formation of the housing body. Particularly preferably, the finished housing no longer comprises the supporting frame.

In accordance with a further embodiment of the method, the leadframe has anchor webs for mechanical stabilization. Particularly preferably, the anchor webs connect the supporting frame to the electrical connection location for the optoelectronic semiconductor chip and/or to the further electrical connection locations for the bond wires. Particularly preferably, the finished housing no longer comprises the mechanical anchor webs.

In accordance with a further embodiment, the method for producing the housing is carried out in a batch process. A plurality of housings are produced in parallel in this case. By way of example, the leadframe, in the course of being provided, is comprised by a panel having a multiplicity of leadframes that are of identical type or identical. Advantageously, a comparatively high packing density on the panel can be produced with the leadframe described here.

During the batch process, the multiplicity of leadframes are each provided with a housing body in parallel, for example by means of foil assisted molding. By way of example, the enveloped leadframes are singulated in a separating process after production of the housing body.

The housing described here is provided in particular for use in an optoelectronic component. Features and embodiments described in connection with the housing in the present case can also be embodied in the case of the optoelectronic component, and vice versa.

In accordance with one embodiment, the optoelectronic component comprises a housing such as has already been described. The external electrical contact locations of the housing are provided for electrically contacting the optoelectronic component from outside.

In accordance with a further embodiment, the optoelectronic component comprises an optoelectronic semiconductor chip.

Furthermore, the optoelectronic component preferably comprises an optical element arranged on the mounting surface of the housing. Particularly preferably, in this case, electrical contact structures of the optical element are electrically conductively connected to the contact surfaces of the contact webs. In this way, by means of an electrical contacting of the external electrical contact locations, it is possible to ascertain in a simple manner whether or not the optoelectronic component still comprises the optical element. The functionality of the optical element can also be checked in this way.

The optical element can be a lens or a diffuser. The optical element is provided in particular for setting an emission characteristic of the optoelectronic semiconductor chip in a desired manner.

Particularly preferably, the electrical contact structures of the optical element are in direct physical contact with the contact surfaces of the contact webs. The electrical contacting is produced in this way.

In accordance with a further embodiment of the optoelectronic component, the optoelectronic semiconductor chip is a radiation-emitting semiconductor chip that emits electromagnetic radiation, preferably visible light, from a radiation exit surface. Preferably, the radiation-emitting semiconductor chip is a surface-emitting semiconductor laser chip, for instance a VCSEL (abbreviation of: "vertical-cavity surface-emitting laser").

If the optoelectronic component comprises a surface-emitting semiconductor laser chip, then the optical element is preferably provided for setting a far field of the semiconductor laser chip in a suitable manner. By way of example, the optical element is provided for setting a power of the electromagnetic radiation of the semiconductor laser chip per area to a desired value which is low enough that the human eye is not harmed. In this context, in particular, it is important to check in a simple manner, before operation of the optoelectronic component, whether the optical element is present and undamaged.

Preferably, the electrically conductive contact structures are provided for this purpose in the optical element and allow the state of the optical element to be checked by way of a resistance measurement. For this purpose, however, the electrical contact structures of the optical element have to be electrically contacted from outside. The bent contact webs are provided for this purpose in the present case, and provide an electrically conductive connection from the mounting surface of the housing to the external electrical contact locations on the rear side. The contact surfaces of the bent contact webs are preferably in direct electrically conductive contact with the electrical contact structures of the optical element and can thus be electrically contacted via the external electrical contact locations in a simple electrical manner.

The method for producing a housing as described here allows, in particular, such a housing to be produced in a particularly simple manner. Conventional housings, in which electrical contacts on a mounting surface are realized for example by multilayer ceramics or printed conductor tracks or else by metallic posts being introduced into the housing body, which are uncovered again by grinding, for example, are generally significantly more cost-intensive or restricted in terms of design freedom.

In accordance with a further embodiment of the optoelectronic component, the optoelectronic semiconductor chip is mounted on an electrical connection location of the leadframe. Furthermore, in this embodiment, particularly preferably, the optoelectronic semiconductor chip is electrically conductively connected to two further electrical connection locations by means of a bond wire.

In accordance with a further embodiment, the optoelectronic component comprises a further diode for protection against electrostatic discharges (ESD diode, short for: "electrostatic discharge diode").

In accordance with one embodiment, the electrical contact structure extends at least partly around an optically active surface of the optical element. The optically active surface has a lens array, for example. The electrical contact structures of the optical element are a conductor track, for example. The electrical contact structures are vapor-deposited for example as a metallic layer onto the optical element. Furthermore, it is also possible for the electrical contact structure to be formed from an electrically conductive paste or from an electrically conductive ink.

Further aspects of the optoelectronic component are specified below in numbered form.

Aspect 1. An optoelectronic component comprising:
a housing comprising:
a leadframe having two external electrical contact locations and two contact webs,
a housing body, into which the leadframe is embedded, wherein
each contact web extends laterally from a respective one of the external electrical contact locations to a mounting surface of the housing, such that contact surfaces of the contact webs are exposed at the mounting surface,
an optoelectronic semiconductor chip,
an optical element arranged on the mounting surface of the housing, wherein
electrical contact structures of the optical element are electrically conductively connected to the contact surfaces of the contact webs.

Aspect 2. The optoelectronic component according to the preceding aspect comprising a housing wall extending around the mounting surface.

Aspect 3. The optoelectronic component according to either of the preceding aspects,
wherein the contact webs have a smaller thickness than the external electrical contact locations.

Aspect 4. The optoelectronic component according to any of the preceding aspects,
wherein the housing body is embodied in black fashion.

Aspect 5. The optoelectronic component according to any of the preceding aspects,
wherein each contact surface is arranged at a bottom surface of a recess.

Aspect 6. The optoelectronic component according to any of the preceding aspects,
wherein the leadframe has a supporting frame extending around the external electrical contact locations.

Aspect 7. The optoelectronic component according to any of the preceding aspects,
wherein the leadframe has anchor webs for mechanical stabilization.

Aspect 8. The optoelectronic component according to any of the preceding aspects,
wherein the electrical contact structures are in direct contact with the contact surfaces of the contact webs.

Aspect 9. The optoelectronic component according to any of the preceding aspects,
wherein the optoelectronic semiconductor chip is a surface-emitting semiconductor laser chip.

Aspect 10. The optoelectronic component according to any of the preceding aspects,
wherein the optoelectronic semiconductor chip is mounted on an electrical connection location of the leadframe and is electrically conductively connected to two further electrical connection locations by means of a bond wire.

The optoelectronic component can be produced for example by the method described below. Features and embodiments disclosed solely in connection with the optoelectronic component in the present case can also be embodied in the case of the method and vice versa.

In accordance with one embodiment of the method for producing an optoelectronic component, a housing described here is provided.

In accordance with one embodiment of the method, an optoelectronic semiconductor chip is applied to a mounting surface of the housing.

In accordance with one embodiment of the method, an optical element is applied to the mounting surface of the housing.

This method, too, can be carried out in a batch process, i.e. in a process in which a plurality of optoelectronic components are produced in parallel. By way of example, the method steps already described above of a batch process for producing a multiplicity of housings are carried out for this purpose. In this case, however, the housings are generally not singulated after production of the housing bodies. Rather, optoelectronic semiconductor chips are generally applied to the electrical connection locations provided for receiving the optoelectronic semiconductor chip. In a next step, the optoelectronic semiconductor chips are generally electrically contacted, for example with the aid of bond wires. Finally, the resultant assemblage can be singulated into individual optoelectronic components at the end. An optical element can then be placed onto each mounting surface of each housing.

Furthermore, it is also possible firstly for all the housings to be provided with the optical element and only then for the optoelectronic components to be separated.

The optoelectronic component can be used for example in a motor vehicle, in devices appertaining to consumer electronics or in sensor technology. If the optoelectronic component comprises a surface-emitting semiconductor laser chip as light source, then one possible application consists in a time of flight measurement.

Particularly preferably, the leadframe contains further structures, such as recesses for alignment, for example, in the edge region extending around the panel.

Further advantageous embodiments and developments of the housing, of the optoelectronic component, of the method for producing a housing, and of the method for producing an optoelectronic component will become apparent from the exemplary embodiments described below in association with the figures.

Figure 2:
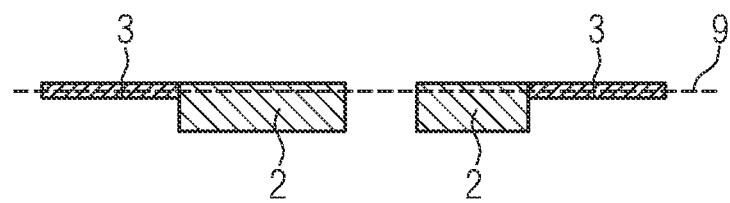
Figure 3:
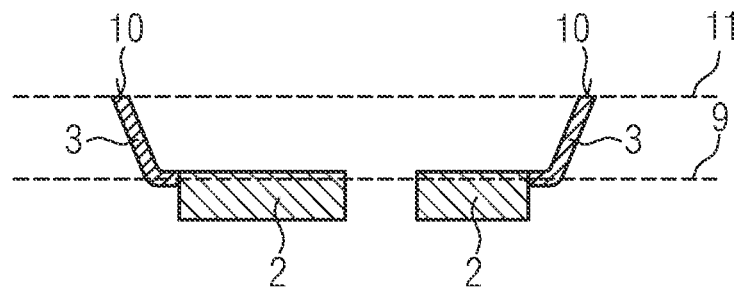

With reference to the schematic illustrations in FIGS. 1 to 3, a method for producing a housing for an optoelectronic component in accordance with one exemplary embodiment is explained in greater detail.

Figure 4:
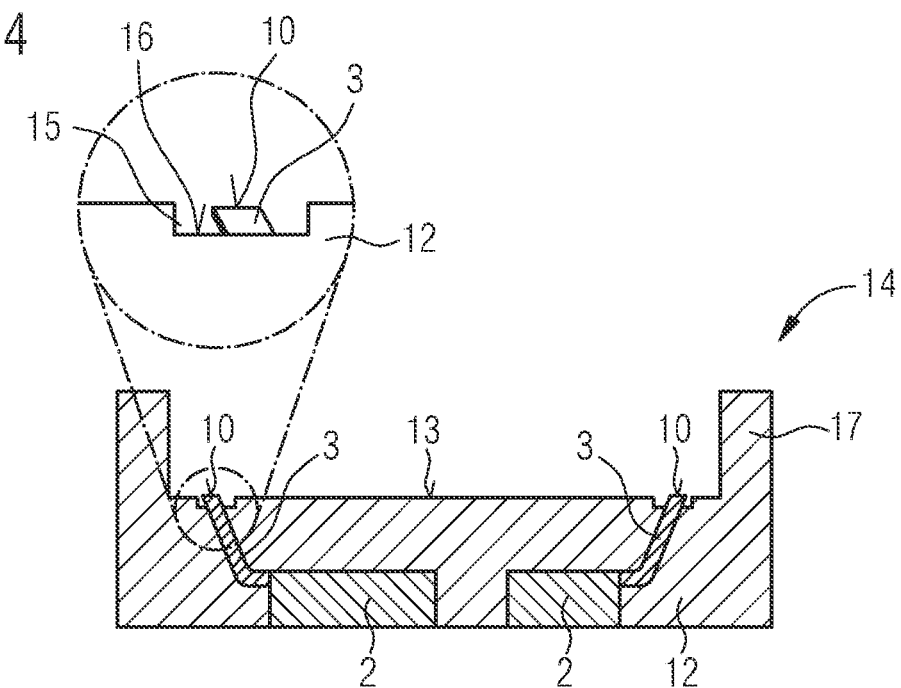

FIG. 4 shows a schematic sectional illustration of a housing in accordance with one exemplary embodiment.

Figure 5:
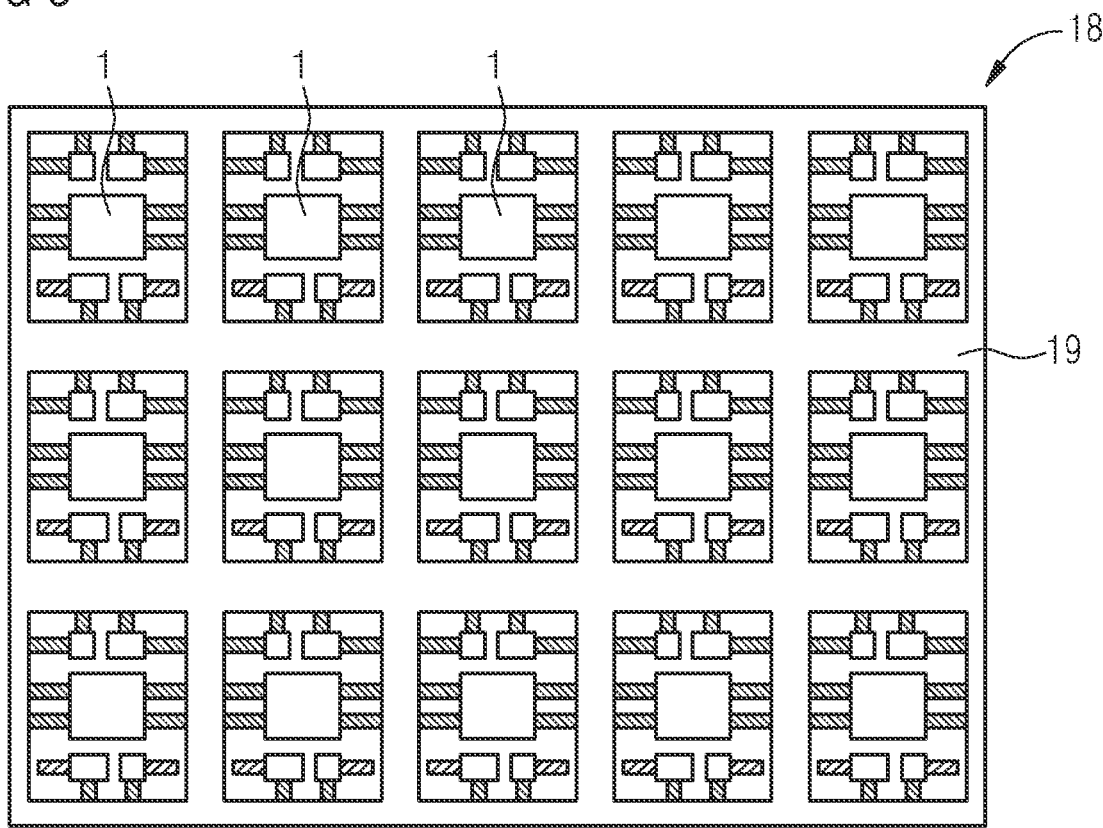
Figure 6:
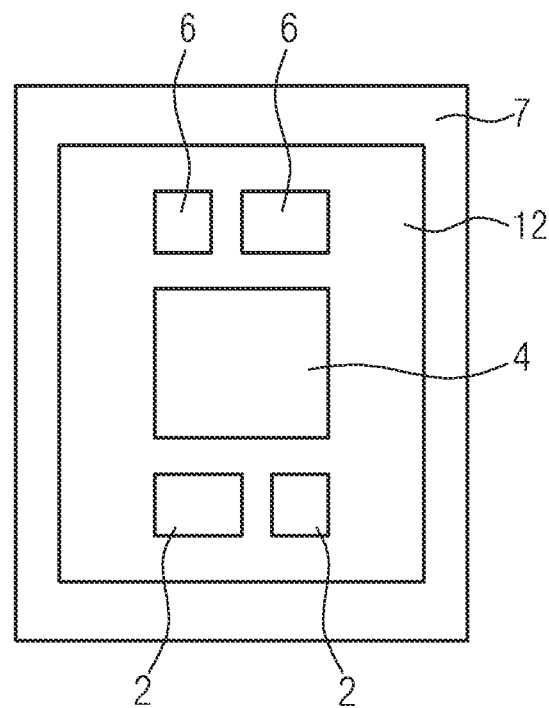

With reference to the schematic illustrations in FIGS. 5 and 6, a method for producing a housing for an optoelectronic component in accordance with a further exemplary embodiment is explained in greater detail.

Figure 7:
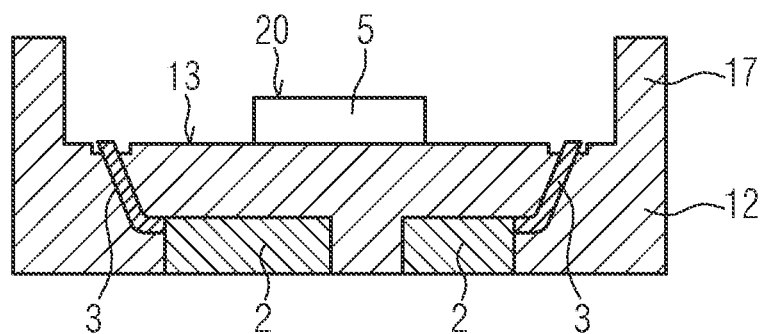
Figure 8:
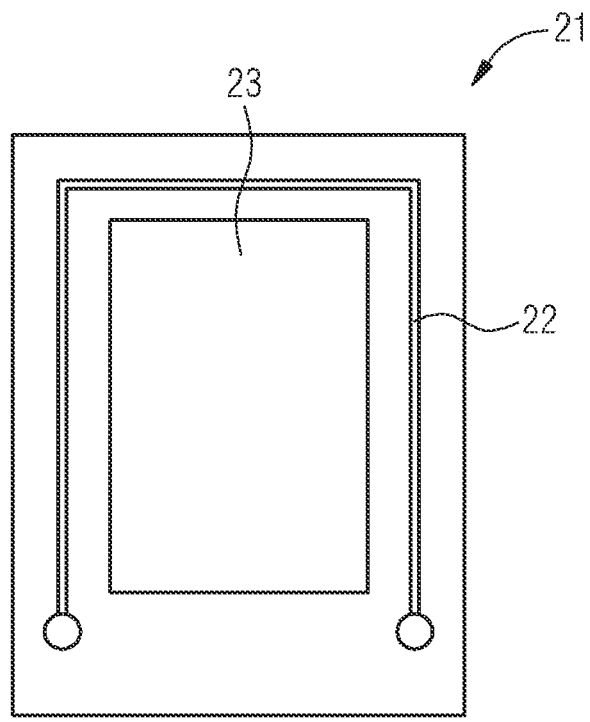

With reference to the schematic illustrations in FIGS. 7 and 8, a method for producing an optoelectronic component in accordance with one exemplary embodiment is explained in greater detail.

Figure 9:
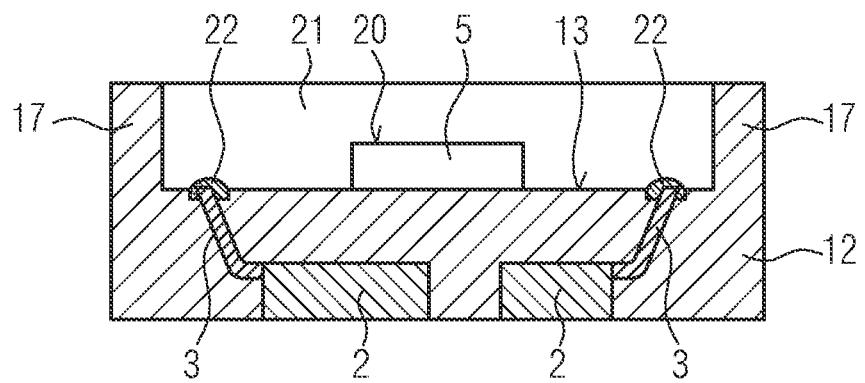

FIG. 9 shows a schematic sectional illustration of an optoelectronic component in accordance with one exemplary embodiment.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with an exaggerated size in order to enable better illustration and/or in order to afford a better understanding.

In the case of the method in accordance with the exemplary embodiment in FIGS. 1 to 3, a leadframe 1 is provided in a first step (FIG. 1).

The leadframe 1 has two external electrical contact locations 2 and two contact webs 3. Moreover, the leadframe 1 comprises an electrical connection location 4 for the mounting of an optoelectronic semiconductor chip 5 and also two further electrical connection locations 6 for electrical contacting with a respective bond wire. In addition, the leadframe 1 has a supporting frame 7. The supporting frame 7 extends completely around the electrical connection location 4 for the mounting of the optoelectronic semiconductor chip 5, the further electrical connection locations 6 for receiving the bond wires and the two external electrical contact locations 2.

Moreover, the leadframe 1 has mechanical anchor webs 8, which connect the electrical connection location 4 for the mounting of the optoelectronic semiconductor chip 5, the further electrical connection locations 6 for receiving the bond wires and the two external electrical contact locations 2 to the supporting frame 7 in a mechanically stable manner.

Each contact web 3 extends laterally from a respective external electrical contact location 2. However, in contrast to the anchor webs 8, the contact webs 3 are not connected to the supporting frame 7.

By way of example, the leadframe 1 is formed from copper and provided with a gold coating at least in places.

FIG. 2 shows a schematic sectional illustration along the line A-A of the leadframe 1 from FIG. 1. In this case, a contact web 3 extends laterally from each external electrical contact location 2. The two contact webs 3 each have a smaller thickness than the external electrical contact locations 2. At a surface of the leadframe 1, the external electrical contact locations 2 terminate flush with the contact webs 3. The external electrical contact locations 2 and the contact webs 3 initially lie in a main plane of extent of the leadframe 1.

In a next step, the contact webs 3 are bent out of the main plane of extent 9 of the leadframe 1 (FIG. 3). Particularly preferably, contact surfaces 10 of the contact webs 3, which are end surfaces of the contact webs 3 in the present case, are situated in a common main plane of extent. In the present case, the common main plane of extent 11 of the contact surfaces 10 runs parallel to the main plane of extent 9 of the leadframe 1.

In a next step, a housing body 12 is produced, which embeds the leadframe 1. In this case, each contact web 3 extends laterally from one of the external electrical contact locations 2 to a mounting surface 13 of the housing 14, wherein the contact surfaces 10 of the contact webs 3 are exposed at the mounting surface 13. The housing body 12 can be produced by means of foil assisted molding, for example. Particularly preferably, a black housing material is used for the housing body 12.

The leadframe 1 is embedded into the housing body 12 in such a way that only surfaces of the leadframe 1 for electrical contacting are exposed, namely surfaces of the external electrical contact locations 2 and also the contact surfaces 10 of the contact webs 3.

The housing 14 in accordance with the exemplary embodiment in FIG. 4 can be produced for example by the method described with reference to FIGS. 1 to 3.

The housing 14 in accordance with the exemplary embodiment in FIG. 4 has a black housing body 12, into which a leadframe 1 is embedded. The leadframe 1 comprises external electrical contact locations 2. A contact web 3 extends laterally from each external electrical contact location 2 to a mounting surface 13 of the housing 14. Contact surfaces 10 of the contact webs 3 are exposed at the mounting surface 13.

The mounting surface 13 has recesses 15, wherein each contact surface 10 is arranged at a bottom surface 16 of a recess 15. The recesses 15 are produced during the production of the housing body 12 by means of foil assisted molding when the contact webs 3 press into a foil with which a mold is lined.

In the case of the housing 14 in accordance with the exemplary embodiment in FIG. 4, the contact webs 3 form an electrically conductive connection from the mounting surface 13 of the housing 14 to a rear side of the housing 14, said rear side being situated opposite the mounting surface 13 and the external electrical contact locations 2 being freely accessible at said rear side. In this case, the external electrical contact locations 2 terminate flush with a surface of the housing body 12.

The mounting surface 13 of the housing 14 in accordance with the exemplary embodiment in FIG. 4 is furthermore surrounded by a housing wall 17 extending completely around the mounting surface 13 in the present case.

In the case of the method in accordance with the exemplary embodiment in FIGS. 5 and 6, in contrast to the method in accordance with the exemplary embodiment in FIGS. 1 and 3, a panel 18 with a multiplicity of leadframes 1 of identical type is provided (FIG. 5). The method in accordance with the exemplary embodiment in FIGS. 5 and 6 is therefore a batch process.

The leadframes 1 are embodied for example as already described with reference to FIG. 1. A common outer frame 19 extends completely around the multiplicity of leadframes 1. The common outer frame 19 comprises for example markings for alignment (not illustrated).

In a next step, the leadframes 1 are surrounded by a multiplicity of housing bodies 12, for example by means of foil assisted molding. FIG. 6 shows by way of example a plan view of a leadframe 1 embedded into a black housing body 12.

Afterward, the housings 14 are singulated, thus giving rise to a multiplicity of housings 14 such as have already been described for example with reference to FIG. 4. In particular, the finished housing 14 no longer comprises a supporting frame 7 of each leadframe 1, rather said supporting frame is removed during singulation.

In the case of the method for producing an optoelectronic component in accordance with the exemplary embodiment in FIGS. 7 and 8, firstly a housing 14 is provided, such as has already been described with reference to FIG. 4.

In a next step, an optoelectronic semiconductor chip 5 is applied to the electrical connection location 4 of the leadframe 1 that is provided for receiving the optoelectronic semiconductor chip 5 (FIG. 7). The optoelectronic semiconductor chip 5 is electrically contacted with bond wires (not illustrated).

The optoelectronic semiconductor chip 5 is for example a surface-emitting semiconductor laser chip, such as a VCSEL. During operation, the surface-emitting semiconductor laser chip 5 emits electromagnetic radiation, preferably visible light, from a radiation exit surface 20.

In a next step, an optical element 21, such as is illustrated schematically in FIG. 8, is applied to a mounting surface 13 of the housing 14, said mounting surface being surrounded by a housing wall 17. The optical element 21 has an electrical contact structure 22 extending partly around an optically active surface 23. The electrical contact structures 22 of the optical element 21 are a conductor track, for example. The electrical contact structures 22 are vapor-deposited as a metallic layer, for example. Furthermore, it is also possible for the electrical contact structure 22 to be formed from an electrically conductive paste or from an electrically conductive ink. The optically active surface 23 has a lens array, for example.

The optoelectronic component in accordance with the exemplary embodiment in FIG. 9 can be produced for example by a method such as has been described with reference to FIGS. 7 and 8.

The optoelectronic component in accordance with the exemplary embodiment in FIG. 9 has a housing 14 such as has already been described with reference to FIG. 4. Furthermore, the optoelectronic component comprises an optoelectronic semiconductor chip 5, for example a surface-emitting semiconductor laser chip. Moreover, an optical element 21 is applied on a mounting surface 13 of the housing 14. A housing wall 17 extends around the optical element 21 and fixes the optical element 21. Furthermore, electrical contact structures 22 of the optical element 21 are in direct contact with the contact surfaces 10 exposed at the mounting surface 13, such that these are electrically conductively connected to one another.

The optical element 21 sets an emission characteristic of the optoelectronic semiconductor chip 5 in a desired manner. If the optoelectronic semiconductor chip 5 is a surface-emitting semiconductor laser chip, then in particular a far field of the surface-emitting semiconductor laser chip is set to a desired value that does not harm the human eye. By means of a resistance measurement via the external electrical contact locations 22 on a rear side of the optoelectronic component, it is advantageously possible to ascertain in a simple manner whether or not the component still comprises the optical element 21.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic component comprising:
   a housing comprising:
      a leadframe having two external electrical contact locations and two contact webs,
      a housing body, into which the leadframe is embedded, wherein
      each contact web extends laterally from a respective one of the external electrical contact locations to a mounting surface of the housing, such that contact surfaces of the contact webs are exposed at the mounting surface, wherein the contact web is bent out of main plane of extent of the leadframe,
   an optoelectronic semiconductor chip,
   an optical element arranged on the mounting surface of the housing, wherein
   electrical contact structures of the optical element are electrically conductively connected to the contact surfaces of the contact webs.

2. The optoelectronic component as claimed in claim 1 comprising a housing wall extending around the mounting surface.

3. The optoelectronic component as claimed in claim 1, wherein the contact webs have a smaller thickness than the external electrical contact locations.

4. The optoelectronic component as claimed in claim 1, wherein the housing body is embodied in black fashion.

5. The optoelectronic component as claimed in claim 1, wherein each contact surface is arranged at a bottom surface of a recess.

6. The optoelectronic component as claimed in claim 1, wherein the leadframe has a supporting frame extending around the external electrical contact locations.

7. The optoelectronic component as claimed in claim 1, wherein the leadframe has anchor webs for mechanical stabilization.

8. The optoelectronic component as claimed in claim 1, wherein the electrical contact structures are in direct contact with the contact surfaces of the contact webs.

9. The optoelectronic component as claimed in claim 1, wherein the optoelectronic semiconductor chip is a surface-emitting semiconductor laser chip.

10. The optoelectronic component as claimed in claim 1, wherein the optoelectronic semiconductor chip is mounted on an electrical connection location of the leadframe and is electrically conductively connected to two further electrical connection locations by means of a bond wire.

\* \* \* \* \*